United States Patent [19]

Kerber

[11] Patent Number: 5,916,821
[45] Date of Patent: Jun. 29, 1999

[54] METHOD FOR PRODUCING SUBLITHOGRAPHIC ETCHING MASKS

[75] Inventor: Martin Kerber, München, Germany

[73] Assignee: Siemens Aktiengesellschaft, Munich, Germany

[21] Appl. No.: 08/682,409

[22] Filed: Jul. 17, 1996

[30] Foreign Application Priority Data

Jul. 17, 1995 [DE] Germany .................. 195 26 011

[51] Int. Cl.$^6$ .................................. H01L 21/312
[52] U.S. Cl. .................. 438/696; 438/735; 438/736; 438/737; 438/947; 216/46
[58] Field of Search .................. 216/58, 46; 438/696, 438/735, 736, 737, 947

[56] References Cited

U.S. PATENT DOCUMENTS

| | | | |
|---|---|---|---|
| 4,648,937 | 3/1987 | Ogura et al. | 438/702 |
| 5,312,781 | 5/1994 | Gregor et al. | 438/756 |
| 5,418,176 | 5/1995 | Yang et al. | 438/449 |
| 5,637,516 | 6/1997 | Muller | 438/203 |
| 5,714,039 | 2/1998 | Beilstein, Jr. et al. | 216/58 |

OTHER PUBLICATIONS

Patent Abstracts Of Japan, E–759, May 18, 1989, vol. 13, No. 213 & JP–A–62–181052 (Hitachi) Jan. 27, 1989.
IBM Technical Disclosure Bulletin, vol. 26, No. 9, Feb. 1984, pp. 4587–4589, (Johnson, Jr. et al.) "Method for making submicron dimension in using sidewall image transfer techniques"; and.
IEEE Electron Device Letters, vol. 14, No. 8, Aug. 1993, pp. 415–417, (Pein et al.) "A 3–D Sidewall Flash EPROM Cell and Memory Array".

*Primary Examiner*—Mark Nuzzolillo
*Assistant Examiner*—Laura Weiner
*Attorney, Agent, or Firm*—Herbert L. Lerner; Laurence A. Greenberg

[57] ABSTRACT

A method for producing sublithographic etching masks for creating structured features in semiconductor products having a large scale of integration, includes applying lines that are orthogonal to one another in successive steps with the aid of the spacer technique. Through the use of various etching steps, a grid of extremely small etching masks is obtained, which is formed by the intersection points of the lines. The size of the etching masks is determined by the layer thickness of the spacer layer, and not by the feature or structure size of the photographic technique.

9 Claims, 3 Drawing Sheets

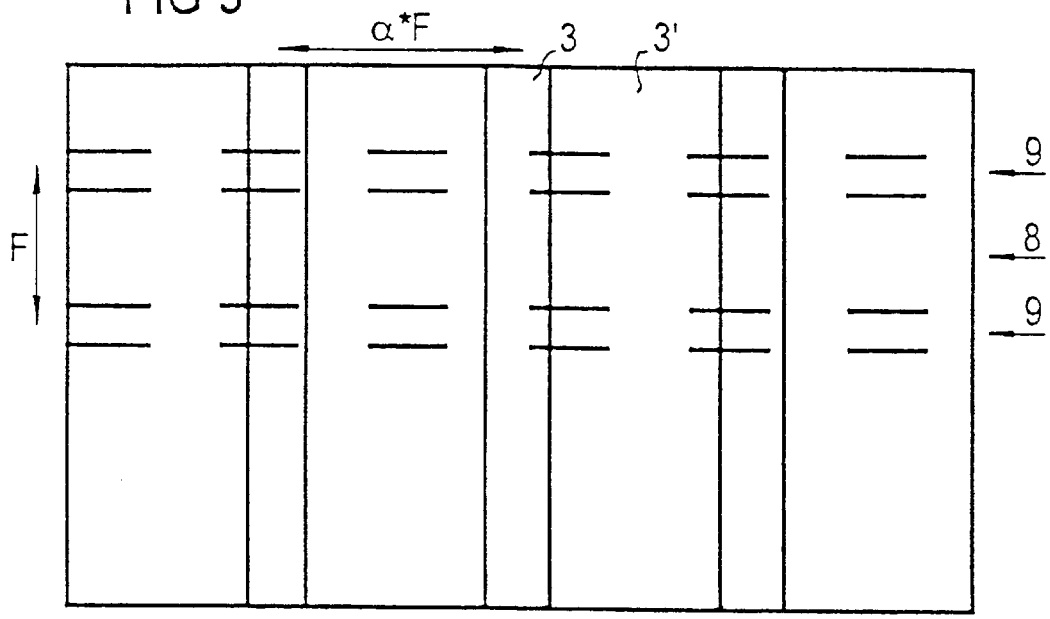
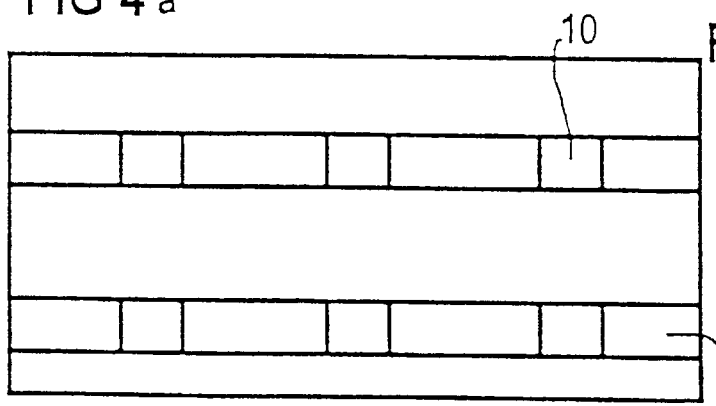
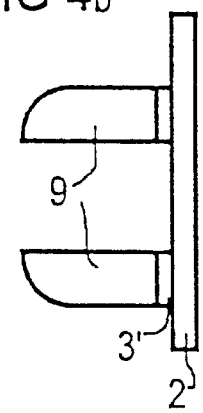
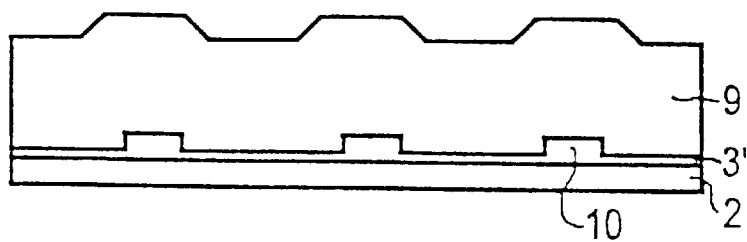

METHOD FOR PRODUCING SUBLITHOGRAPHIC ETCHING MASKS

BACKGROUND OF THE INVENTION

Field of the Invention

The invention relates to a method for producing sublithographic etching masks for creating structural features or structures in semiconductor products having a large scale of integration.

In semiconductor products having an extremely large scale of integration, such as in integrated semiconductor memories, the structural fineness of the photolithography is often a limiting factor. In the case of a particular photolithography generation having a minimum structural fineness (feature size) F, the size of the smallest elements of a periodic array is expressed by the equation $$(2 \times F)^2 = 4F^2.$$

A point of departure for increasing the packing density of memory cells is the vertical configuration of the memory cells. They are also known as 3-D Sidewall Flash EPROM cells. The active component is constructed as a cylinder, and a first insulating polyspacer (floating gate) is constructed around the cylinder. The floating gate is surrounded by an interpolydielectric and by a further polyring (control gate). Due to the vertical configuration, the lateral insulation oxide is omitted. Through the use of a suitable disposition of the cylinders, a self-adjusted word line is achieved by the growing together of the control gates in one direction, while they are separated orthogonally thereto. However, minimizing the size of the grid period of the cylinders is limited by the feature size of the photolithography technique.

SUMMARY OF THE INVENTION

It is accordingly an object of the invention to provide a method for producing sublithographic etching masks, which overcomes the hereinafore-mentioned disadvantages of the heretofore-known methods of this general type and which provides especially small features.

With the foregoing and other objects in view there is provided, in accordance with the invention, a method for producing sublithographic etching masks in semiconductor products having a large scale of integration, which comprises:

(a) generating an oxide layer on a semiconductor substrate and generating a silicon layer on the oxide layer;

(b) applying an auxiliary layer to the silicon layer;

(c) structuring the auxiliary layer to form first strips having edges;

(d) creating a first spacer at the edges of the first strips;

(e) removing the auxiliary layer;

(f) partially removing the silicon layer using the first spacer as a mask;

(g) removing the first spacer and leaving an elevated region of the silicon layer standing in place of the first spacer;

(h) applying a further auxiliary layer and structuring the further auxiliary layer to form second strips being oriented in a different direction from the first strips and intersecting the first strips;

(i) analogously, repeating steps (d) through (g) with a second spacer, forming elevated-intersection regions between the elevated region of the silicon layer and the second spacer, and completely removing the silicon layer in step (f) using the second spacer as a mask;

(j) removing the silicon layer previously located beneath the second spacer and already having been partially removed in step (f), far enough to entirely remove regions outside the elevated intersection regions and leave a remnant of the elevated intersection regions;

(k) structuring the oxide layer located beneath the silicon layer using the elevated intersection regions as a mask; and (l) actually creating the structures using the etched oxide layer as an etching mask.

In accordance with the fundamental concept of the invention, a spacer technique for creating subphotolithographic lines is performed twice, with the lines intersecting. The intersection points form a grid of extremely small etching masks. The size of the etching masks is determined by the layer thickness of the spacer technique, and not by the feature size of the phototechnique. The result is a structure with periodically repeating elements, having a length which is only somewhat greater than the feature size F. This produces a minimum cell area of approximately $F^2$, as compared to $4F^2$ with conventional methods.

Specifically, in the method for producing sublithographic etching masks for creating structural features in semiconductor products with a large scale of integration, first an oxide layer is generated on a semiconductor substrate and then a silicon layer is generated on the oxide layer. An auxiliary layer is applied to the silicon layer and then the auxiliary layer is structured in stripwise fashion producing first strips. A first spacer is created at the edges of the thus-structured auxiliary layer, and then the auxiliary layer is removed. The silicon layer is partially removed, using the first spacer as a mask, whereupon then the first spacer is removed, so that in its place an elevated region of the silicon layer remains standing. Then a further auxiliary layer is applied and likewise structured in stripwise fashion producing second strips. These second strips are oriented in a different direction from the first strips and intersections are thus formed between the first and second strips. A second spacer is created on the edges of the thus-structured auxiliary layer, and then this second auxiliary layer is removed. Then, the silicon layer is removed entirely in a second etching, using the second spacer as a mask. Then the second spacers are removed, and the silicon layer previously located beneath the spacer is removed to the extent that the regions outside the elevated intersection regions are removed entirely, and only a remnant of the elevated intersection regions remains. Next, the oxide layer located beneath the silicon layer is structured, using the intersection regions as a mask. The thus-etched oxide layer is then used as an etching mask for the actual creation of structural features in the silicon layer.

Through the use of this method, a structural feature can be produced that has a minimum cell area which is four times smaller than that created by the conventional photolithography process.

In accordance with another mode of the invention, the auxiliary layers are created from TEOS (tetraethyloxysilicate) by deposition of silicon oxide, and are photolithographically structured. Using TEOS is advantageous because in this way the auxiliary layer or the structured strips can later be removed isotropically by wet-chemical etching, since preferably amorphous silicon or polycrystalline silicon is used as the underlying layer.

In accordance with a further mode of the invention, the structuring of the auxiliary layers is carried out by conventional photolithography, but with the method of the invention the etching masks being actually used later are located at corner points of the photolithographically created structural features, and in this way a decrease in area by nearly a factor of 4 is attained.

In accordance with an added mode of the invention, the spacers are created by conformal deposition of nitride on the edges of the respective structured auxiliary layer and ensuing anisotropic etching. The structural width of the resultant spacer is no longer determined by the phototechnique but rather by the deposition process. The spacer technique permits substantially finer structural features of down to 20 nm. The spacer is created at each edge of the auxiliary layer.

In accordance with an additional mode of the invention, the silicon layer is removed in the first etching process by anisotropic etching to an extent of approximately two-thirds. At least half the silicon layer should be removed in this first etching process, so that the intersection regions according to the invention can be created as an etching mask in the later etching processes.

In accordance with yet another mode of the invention, the first spacers are created with the same width as the second spacers. The result, after the conclusion of the various etching steps for the silicon layer, is intersection regions each having the same length on a side.

In accordance with yet a further mode of the invention, the first and second strips are oriented orthogonally to one another. In this way square intersection regions are obtained. It may also be advantageous to define the spacer width and the orientation of the strips relative to one another in such a way that the intersection regions are rectangular or rhomboid in shape.

In accordance with yet an added mode of the invention, the second strips are created with a different width from the first strips.

Self-adjustment of a word line is obtained through the use of a minimum width and minimum spacing of the strips that are made from the TEOS auxiliary layer, and the structure of a bit line is attained through the use of a somewhat greater spacing of the strips in the other direction. This can be done, for instance, by forming the first strips with a width $\alpha*F$ ($\alpha>1$) and the second strips with the minimum width of the feature size F.

In accordance with yet an additional mode of the invention, the cylinders for 3-D Sidewall Flash EPROM cells are produced with the etching mask that is created. In the course of the production method, the edges of the cylinders are rounded, giving them the shape of a column. These cells include vertical cylinders and their vertical configuration likewise already assures an increase in the packing density. By employing the method of the invention, cylinders can be made so thin that they are entirely depleted or in other words are free of charge carriers.

In accordance with a concomitant mode of the invention, the oxide layer acting as an etching mask is used as an implantation mask. Thus the mask being used to create the cylinders can also be used for additional functions. Naturally, it is equally possible to remove the masking oxide layer in the usual way.

Other features which are considered as characteristic for the invention are set forth in the appended claims.

Although the invention is illustrated and described herein as embodied in a method for producing sublithographic etching masks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a plan view of upper layers which are machined according to the method, with first spacers;

FIG. 4a is a plan view and FIGS. 4b and 4c are cross-sectional views, of upper layers that are machined according to the invention with second spacers being created;

FIG. 5a is a plan view and FIGS. 4b and 4c are cross-sectional views, of the semiconductor substrate and the machined upper layers in a stage of the method in which intersection regions are created.

DESCRIPTION OF THE PREFERRED EMBODIMENTS

Figure 1:
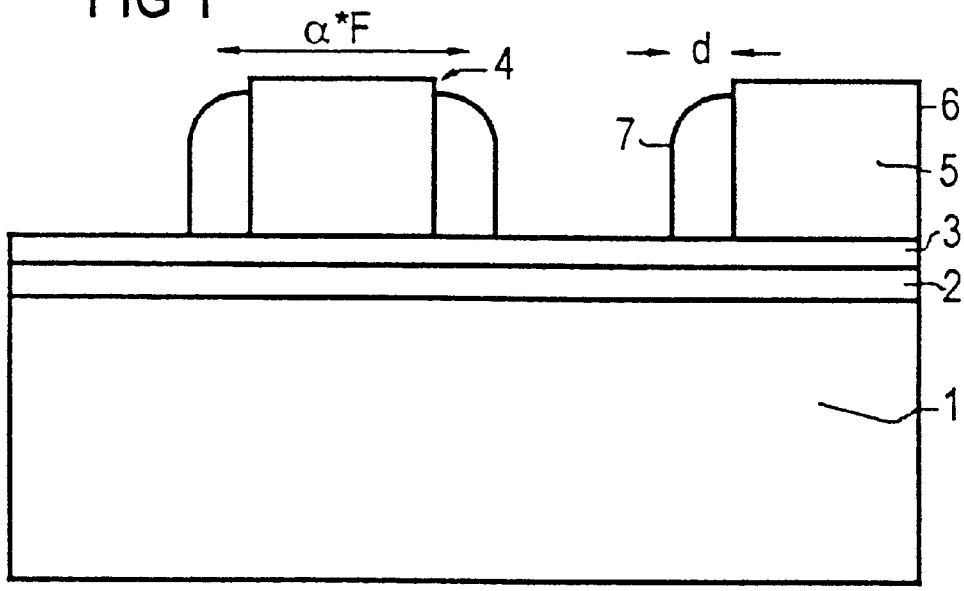
FIG. 1 is a diagrammatic, cross-sectional view of a semiconductor substrate and applied layers, as seen at the beginning of the method.

Referring now in detail to the figures of the drawings in which a production process is diagrammatically illustrated and first, particularly, to FIG. 1 thereof, there is seen a semiconductor substrate 1, which as a rule is formed of crystalline silicon, with an oxide layer 2 created or deposited thereon. An amorphous or polycrystalline silicon layer 3 is deposited to a thickness x on this layer of silicon oxide. An auxiliary layer 4, preferably of TEOS (tetraethyloxysilicate), is deposited and structured over the layer 3. The structuring is carried out photolithographically, with which structures having a feature or structure size F can be made at best. In the process, strips 5 are created that are oriented parallel to one another. A first spacer 7 is then created on the edges 6 of the strips 5, by conformal deposition and ensuing anisotropic etching. The spacer 7 has a width d, which is preferably equivalent to the thickness x of the silicon layer 3. The spacers can be made with a minimum width of approximately 20 nm. The spacers repeat at an interval $\alpha*F$, in which $\alpha$ is greater than 1. The spacer is formed of a material such as silicon nitride that can be etched selectively with respect to the auxiliary layer and the underlying layer.

Figure 2:
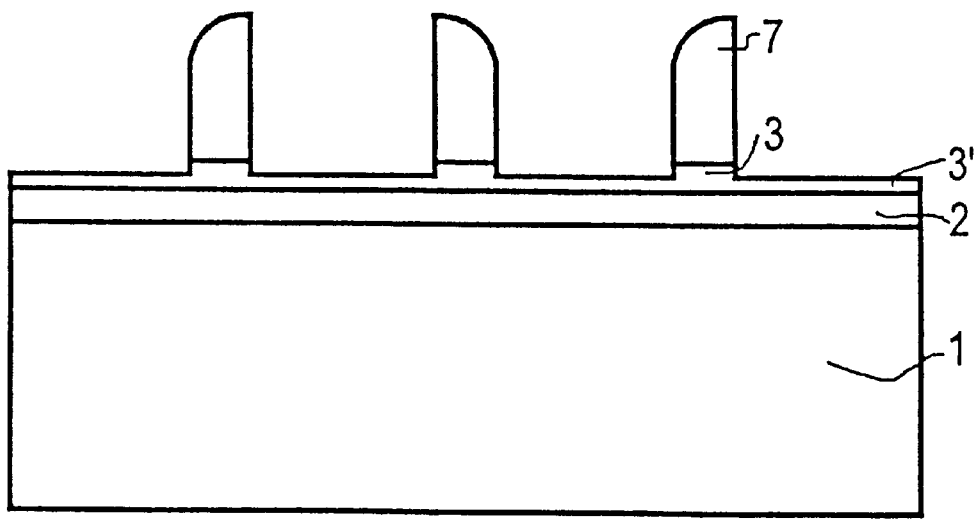
FIG. 2 is a cross-sectional view of the semiconductor substrate and the applied layers, in an ensuing method step.

Next, the TEOS auxiliary layer 4 is removed isotropically, as shown in FIG. 2. The spacer 7 then serves as a mask for a first anisotropic etching of the deposited silicon layer 3, in which this layer is etched at least halfway but not completely. Preferably, the silicon layer is etched to an extent of two-thirds. Next, the first spacers 7 are removed, so that all that remains standing in their place is an elevated region of a silicon layer 3'.

This structuring can be seen in FIG. 3, in which the partially etched-away silicon layer 3' is then present, in place of the strips which were previously covered with the auxiliary layer 4, and the still fully preserved silicon layer 3 remains on their sides, in place of the spacers 7. Subsequently, another auxiliary layer is again applied, and strips 8 are created orthogonally to the direction of the strips 5 by photolithography. Second pacers 9 are created by deposition and etching at edges of the strips 8. These spacers 9 are formed with a minimum possible spacing F from one another and are shown in dashed lines in FIG. 3.

After removal of the auxiliary layer and a second anisotropic etching of the silicon layer 3', in which the silicon layer 3' is removed completely outside the second spacer strips 9, a stage of the method which is shown in FIGS. 4a, 4b and 4c is reached. FIG. 4a shows a plan view in which the silicon layer 3' has been removed entirely outside the second spacers 9, so that there the oxide layer 2 is located on the surface. In the region of the second spacers, the silicon layer 3' is still present to some extent, where it was not removed in the first etching, and is even still completely present in an intersection region 10 where the first spacers 7 previously extended. FIG. 4c shows a cross section through the oxide layer 2 and the silicon layer 3' in the region of the second spacer 9. In FIG. 4b, a cross section in a direction orthogonal to the second spacers 9 is shown that does not extend through the intersection region 10.

Figure 5A:
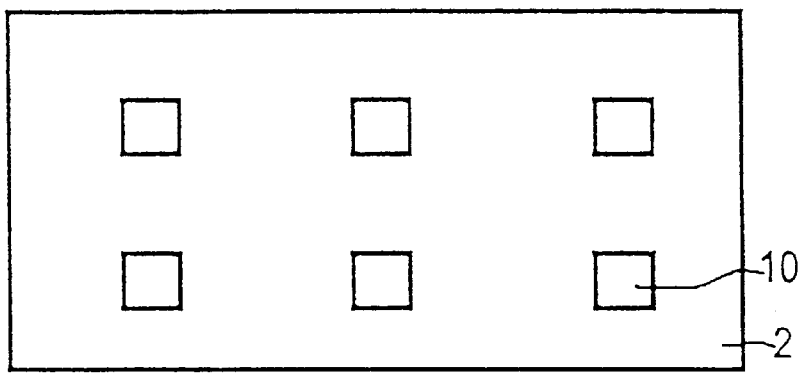
Figure 5B:
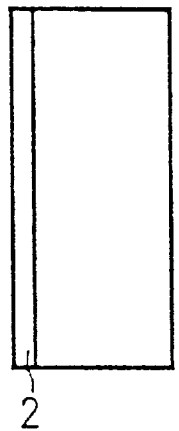
Figure 5C:
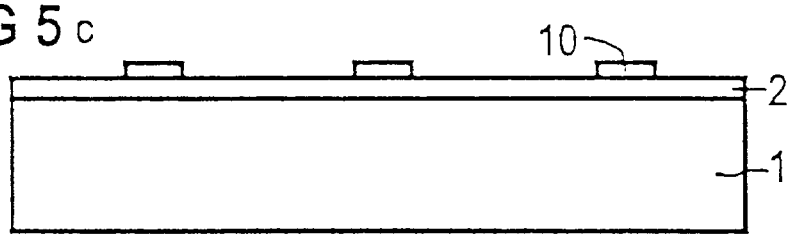

Next, the second spacers 9 are isotropically removed selectively to the silicon and the oxide. What remains are the silicon strips with protuberances at the locations of the first spacers 7. Through the use of a further, full-surface anisotropic etching, precisely enough silicon is then removed to ensure that while the intersection regions 10 of the two lines of spacers 7 and 9 do not disappear completely, nevertheless the regions outside the intersection regions 10 are etched away entirely. This situation is shown in FIGS. 5a, 5b and 5c. FIGS. 5b and 5c show various cross sections through the plan view of FIG. 5a. It can be seen from FIG. 5c that the intersection regions have been etched away except for a remnant, which corresponds precisely to the difference between the elevated intersection regions 10 and the still remaining thickness of the silicon layer 3 in FIG. 4c.

Figure 6:
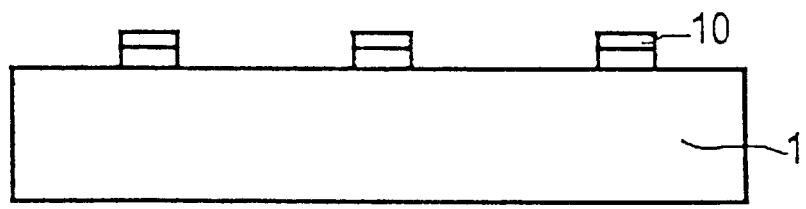
FIG. 6 is a cross-sectional view of the semiconductor substrate with a finished etching mask resting thereon.

These intersection regions 10 of silicon are then used as an etching mask for the oxide layer 2 located beneath them, resulting in a structural feature or structure as shown in the cross section of FIG. 6. These intersection regions of oxide then in turn serve as an etching mask for the actual deep etching in the semiconductor substrate 1 to create the active cylinders.

I claim:

1. A method for producing sublithographic etching masks in semiconductor products having a large scale of integration, which comprises:

(a) generating an oxide layer on a semiconductor substrate and generating a silicon layer on the oxide layer;

(b) applying an auxiliary layer to the silicon layer;

(c) photolithographically structuring the auxiliary layer to form first strips having edges;

(d) creating a first spacer at the edges of the first strips;

(e) removing the auxiliary layer;

(f) partially removing the silicon layer using the first spacer as a mask;

(g) removing the first spacer and leaving an elevated region of the silicon layer standing in place of the first spacer;

(h) applying a further auxiliary layer and photolithographically structuring the further auxiliary layer to form second strips being oriented in a different direction from the first strips and intersecting the first strips;

(i) repeating steps (d) through (g) with a second spacer and the second strips, respectively, forming elevated intersection regions between the elevated region of the silicon layer and the second spacer, and completely removing the silicon layer in step (f) using the second spacer as a mask;

(j) removing the silicon layer previously located beneath the second spacer and already having been partially removed in step (f), far enough to entirely remove regions outside the elevated intersection regions and leave a remnant of the elevated intersection regions;

(k) structuring the oxide layer located beneath the silicon layer using the elevated intersection regions as a mask; and (l) creating structures using the etched oxide layer as an etching mask.

2. The method according to claim 1, which comprises creating the auxiliary layers by depositing silicon oxide from TEOS (tetraethyloxysilicate).

3. The method according to claim 1, which comprises creating the spacers by deposition of nitride on the edges of the respective structured auxiliary layers and anisotropic etching.

4. The method according to claim 1, wherein the step of partially removing the silicon layer comprises anisotropically etching off approximately two-thirds of a thickness of the silicon layer.

5. The method according to claim 1, which comprises creating the first spacers with the same width as the second spacers.

6. The method according to claim 1, which comprises orienting the first and second strips orthogonally to one another.

7. The method according to claim 1, which comprises creating the second strips with a different width than the first strips.

8. The method according to claim 1, which comprises generating cylinders for 3-D Sidewall Flash EPROM cells with the oxide layer acting as an etching mask.

9. The method according to claim 8, which comprises also using the oxide layer acting as an etching mask as an implantation mask.

* * * * *